United States Patent [19]

Hirochi

[11] Patent Number: 4,803,383
[45] Date of Patent: Feb. 7, 1989

[54] TRANSISTOR-TRANSISTOR LOGIC CIRCUIT

[75] Inventor: Katsuji Hirochi, Kawasaki, Japan

[73] Assignee: Fujitsu Limited, Kawasaki, Japan

[21] Appl. No.: 115,870

[22] Filed: Nov. 2, 1987

[30] Foreign Application Priority Data

Oct. 31, 1986 [JP] Japan ................. 61-260942

[51] Int. Cl.$^4$ ............. H03K 19/003; H03K 19/088; H03K 17/60; H03K 17/28
[52] U.S. Cl. ............................ 307/456; 307/443; 307/602; 307/544; 307/446
[58] Field of Search ............. 307/456, 457, 458, 254, 307/255, 542, 547, 549, 299.1, 544, 454, 446, 280, 300, 553, 563, 546, 602

[56] References Cited

U.S. PATENT DOCUMENTS 4,581,550  4/1986  Ferris et al. ............... 307/456 X
4,661,727  4/1987  Ferris et al. ............... 307/456
4,697,103  9/1987  Ferris et al. ............... 307/456
4,698,525 10/1987  Tavana et al. ............. 307/456

Primary Examiner—William L. Sikes
Assistant Examiner—David R. Bertelson
Attorney, Agent, or Firm—Staas & Halsey

[57] ABSTRACT

A transistor-transistor logic circuit, i.e., TTL circuit includes at least one input terminal (IN; IN$_1$, IN$_2$), an output transistor (T10, T1), and elements (1, 2, T11, T12; 3, 4, T2) operatively connected between an input terminal and the base of an output transistor. The elements include a plurality of delay parts, each having a different signal propagation delay time respectively which feed base currents to the base of the output transistor in and at a different times. As a result, a quick change in the output is prevented and thus an overshoot, ringing or noise can be prevented, while realizing an increased driving ability. At the same time, optimum output characteristics can be obtained according to a load to be driven by the TTL circuit.

18 Claims, 9 Drawing Sheets $(IB_1' > IB_2' > IB_3')$

TRANSISTOR-TRANSISTOR LOGIC CIRCUIT

BACKGROUND OF THE INVENTION

1. Field of the Invention

The present invention relates to a transistor-transistor logic (TTL) circuit and, more particularly, to a TTL circuit in which an output characteristic of an output transistor is improved.

2. Description of the Related Art

A known typical TTL circuit includes an output transistor, a phase-splitting transistor having an emitter connected to the base of the output transistor and a collector connected through a resistor to a higher voltage power supply line, and an input transistor for receiving an input signal and transmitting a change thereof to the base of the phase-splitting transistor. In this arrangement, the potential at the collector of the output transistor serves as an output of the TTL circuit.

For example, assume that when the input signal is at a logic low level (hereinafter referred to as L level), the input transistor is ON and the phase-splitting transistor is OFF. In this state, the output transistor is OFF and the output of the TTL circuit is at a logic high level (hereinafter referred to as H level), and when the input signal changes from the L level to the H level, the input transistor is turned OFF and the phase-splitting transistor is turned ON. As a result, currents are fed from the power supply line through the resistor and phase-splitting transistor to the base of the output transistor, the output transistor is turned ON, and the output goes from the H level to the L level.

Therefore, an external circuit connected to the collector of the output transistor is driven by the ON and OFF operation of the output transistor, which operates according to the amount of base current thereof. In this case, to ensure that the external circuit is driven with a high reliability, a sufficient base current must be fed to the output transistor, to increase the driving ability thereof. When the driving ability is increased simply by increasing the base current, however, an overshoot or ringing often occurs in the output waveform. This may cause a mis-operation in a subsequent circuit to be connected to the collector of the output transistor. Also, a quick change in currents may cause electromagnetic waves resulting in the appearance of noise.

SUMMARY OF THE INVENTION

It is an object of the present invention to provide a TTL circuit which can prevent a quick change in the output, to substantially check the generation of an overshoot, ringing, or noise, while realizing an increased driving capability.

It is another object of the present invention to provide a TTL circuit in which high operational performance and reliability are realized.

It is a still another object of the present invention to provide a TTL circuit in which optimum output characteristics can be obtained in accordance with a load to be driven thereby.

The drawbacks of the prior art can be overcome by controlling the amount of current to be fed to the base of an output transistor. Concretely, in the present invention, the amount of current to be fed to the base of the output transistor is changed by stages in a step-by-step manner when the level of an input signal is changed.

Therefore, according to one aspect of the present invention, there is provided a transistor-transistor logic circuit including: a first and a second power supply lines; at least one input terminal; an output terminal; an output transistor having an emitter connected to the second power supply line and a collector connected to the output terminal; a plurality of phase-splitting transistors, each emitter thereof being connected to the base of the output transistor and each collector thereof being connected through a resistor to the first power supply line; and a delay circuit operatively connected between the input terminal and each base of the plurality of phase-splitting transistors, transmitting the change in a signal applied to the input terminal separately to each base with a different propagation delay time, respectively.

Also, according to another aspect of the present invention, there is provided a transistor-transistor logic circuit including: a first and a second power supply line; at least one input terminal; an output terminal; an output transistor having an emitter connected to the second power supply line and a collector connected to the output terminal; a phase-splitting transistor having an emitter connected to the base of the output transistor and a collector connected through a resistor to the first power supply line; an input stage circuit for transmitting the change of a signal applied to the input terminal to the base of the phase-splitting transistor; and a delay circuit having a plurality of delay parts operatively connected between the input terminal and the base of the output transistor, each having a different signal propagation delay time, respectively, and, in simultaneous response to the signal at the input terminal, feeding base currents to the base of the output transistor in sequence at a different timing.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments, the problems in the prior art will now be explained with reference to FIGS. 1 and 2.

Figure 1:
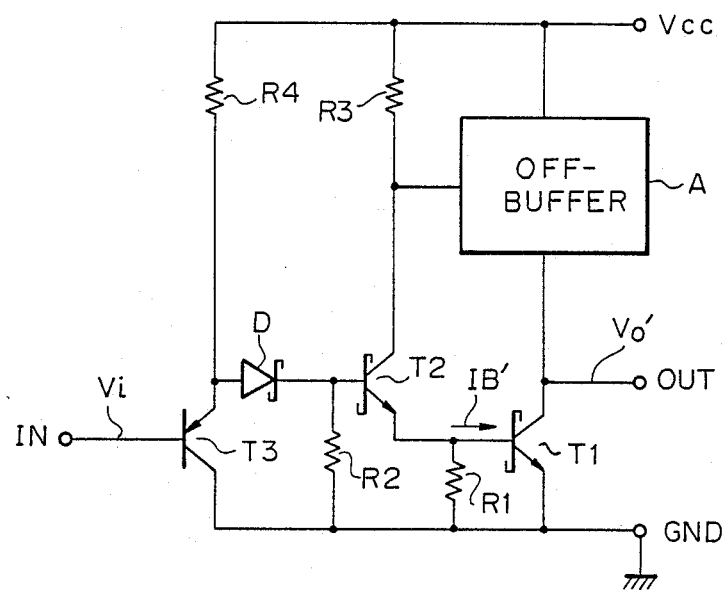
FIG. 1 is a circuit diagram illustrating a typical conventional TTL circuit.

FIG. 1 shows a circuit diagram of a typical conventional TTL circuit. The TTL circuit includes, as principal circuit elements, an output transistor T1, a phase-splitting transistor T2 having an emitter connected to the base of the output transistor and a collector connected through a resistor R3 to the power supply line $V_{CC}$, and an input transistor T3 for transmitting the change of an input signal $V_i$ through a diode D to the base of the phase-splitting transistor. Reference A denotes an off-buffer circuit, which increases the rate of the rise of an output signal $V_o'$ when the signal $V_o'$ changes from L level to H level. Also, a driven circuit (not shown) is connected to the collector of the output transistor T1, i.e., an output terminal OUT. Accordingly, the driven circuit is driven by the ON and OFF operation of the output transistor T1.

In the circuit shown in FIG. 1, when the input signal $V_i$ is at L level, the input transistor T3 is turned ON and the phase-splitting transistor T2 is turned OFF. Accordingly, the output transistor T1 is turned OFF and the output $V_o'$ is at H level. Conversely, when the input signal $V_i$ is at H level, the input transistor T3 is turned OFF, and the phase-splitting transistor T2 is turned ON, because currents are fed to the base thereof from the power supply line $V_{CC}$ through the resistor R4 and the diode D. The output transistor T1 is turned ON because base currents IB' are fed thereto from the power supply line $V_{CC}$ through the resistor R3 and the transistor T2 and, accordingly, the output $V_o'$ is at L level.

Therefore, the above-described TTL circuit as a whole functions as an inverter. When the input signal $V_i$ changes from L level to H level, the output transistor T1 is turned ON. In this case, the ON state is effected by the supply of the base current IB', which is determined in accordance with the resistances of the resistors R3 and R4. Accordingly, the driving ability of the output transistor T1 must be increased as the load to be driven increases, and therefore, the resistance of the resistor R3 must be made as small as possible to increase the base current IB'.

Figure 2:
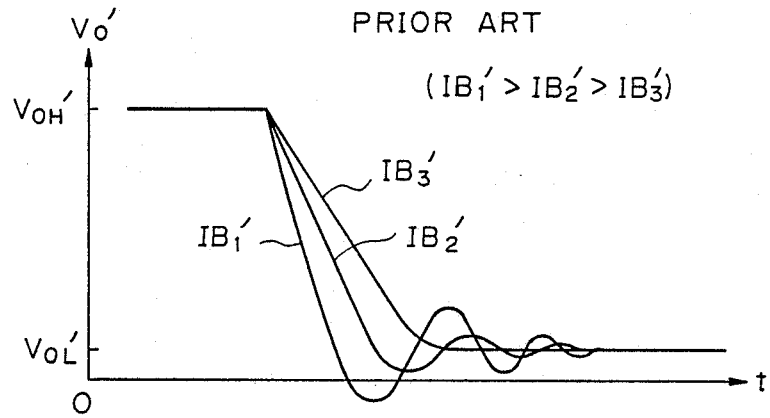
FIG. 2 is a waveform diagram illustrating output characteristics of the circuit shown in FIG. 1.

FIG. 2 represents waveforms in the output characteristics of the circuit shown in FIG. 1. As described above, in order to increase the driving ability of the output transistor T1, the base current IB' must be increased. However, when the base current IB' is increased, a problem arises in that an overshoot or ringing appears in the waveform of the output $V_o'$, and thus a mis-operation occurs in a subsequent circuit, i.e., a driven circuit. Another problem arises in that electromagnetic waves are generated due to the quick change in currents, resulting in the appearance of noise. The larger the base current, the more conspicuous are the problems (see FIG. 2). Moreover, the above problems lead to a decline of the performance of the TTL circuit, i.e., a reduced reliability in operation, which is not preferable.

Still another problem arises in that optimum output characteristics according to a load, i.e., the driven circuit cannot be obtained, because the amount of the base current IB' is fixedly determined in accordance with the resistances of the resistors R3 and R4.

The present invention was created in order to solve the above problems.

A preferred embodiment of the present invention will be described hereinafter in detail with reference to FIGS. 3, 4A and 4B.

Figure 3:
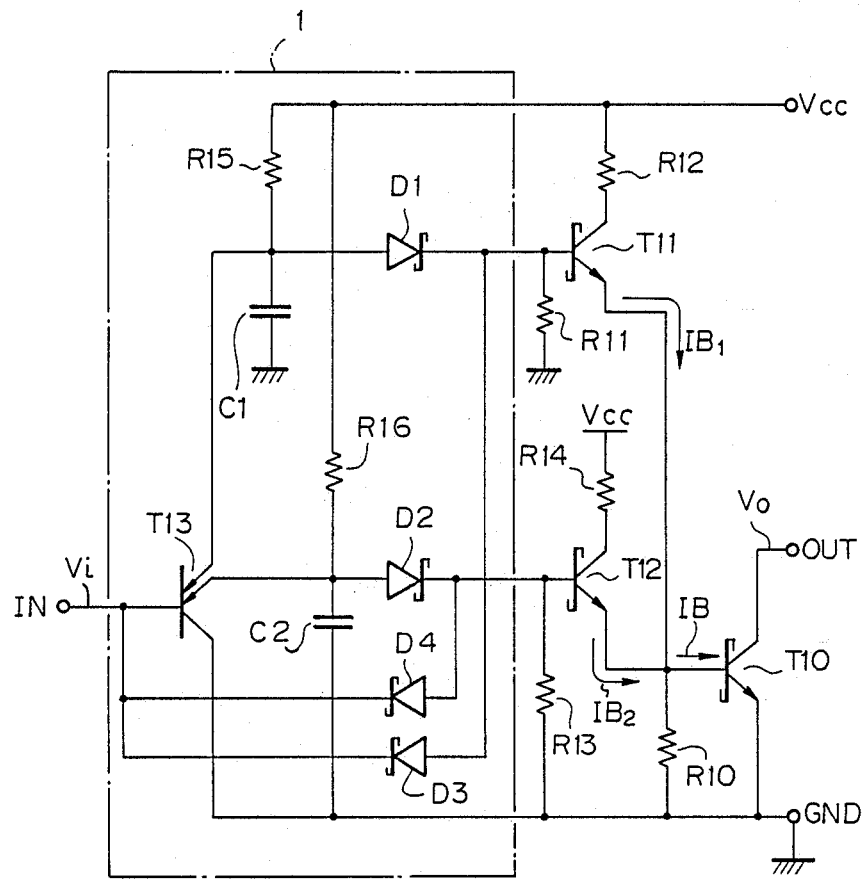
FIG. 3 is a circuit diagram illustrating a TTL circuit as an embodiment of the present invention.
Figure 4A:
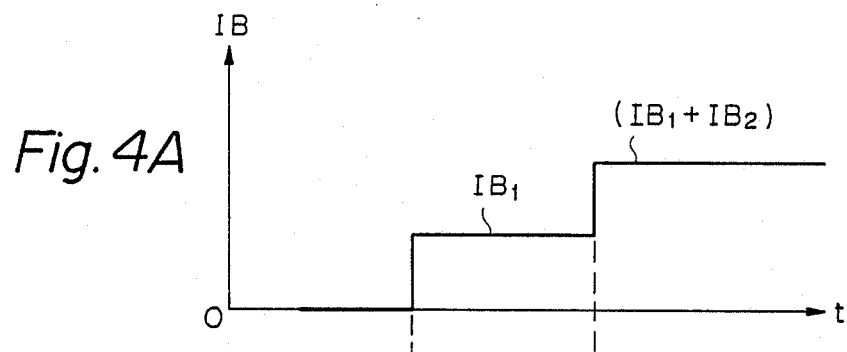
FIGS. 4A and 4B are waveform diagrams illustrating the change of base current in an output transistor and output characteristics of the circuit shown in FIG. 3.
Figure 4B:
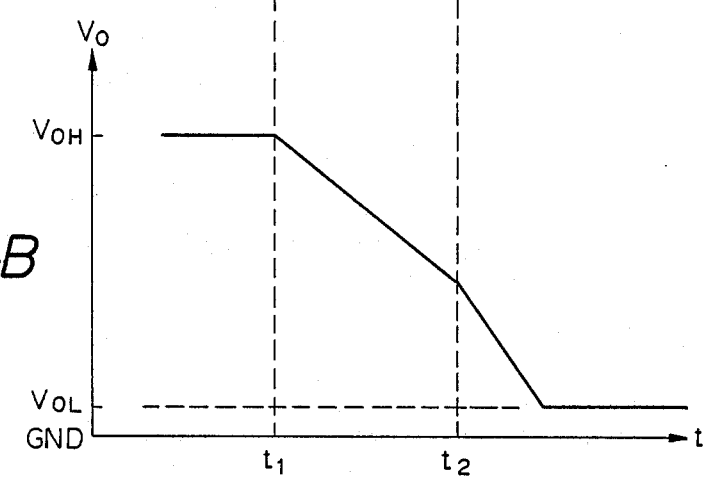

In the circuit of FIG. 3, reference T10 denotes an NPN output transistor having the form of a Schottky diode clamp type transistor. The emitter of the transistor T10 is connected to a lower voltage power supply line, i.e., a grounded line GND, and the base thereof is grounded via a resistor R10. The collector of the output transistor T10, i.e., an output terminal OUT, is made open, but may be connected to a higher voltage power supply line $V_{CC}$ via an off-buffer circuit or a Darlington circuit (not shown).

Reference T11 denotes an NPN phase-splitting transistor having the form of a Schottky diode clamp type transistor. The emitter of the transistor T11 is connected to the base of the output transistor T10, the base thereof is grounded via a resistor R11, and the collector thereof is connected via a resistor R12 to the power supply line $V_{CC}$. When the phase-splitting transistor T11 is turned ON, the current $IB_1$ is fed to the base of the output transistor T10. The current $IB_1$ is determined in accordance with the resistances of the resistors R12 and R15, and is sufficient to turn ON the output transistor T10. Reference T12 denotes an NPN phase-splitting transistor having the form of a Schottky diode clamp type transistor, which is provided in the same manner as the phase-splitting transistor T11 and has the same function.

Reference 1 denotes a delay circuit, which is connected between an input terminal IN and each base of phase-splitting transistors T11 and T12. In the delay circuit 1, reference T13 denotes a multi-emitter type PNP input transistor, having a base connected to the input terminal IN and a collector connected to the grounded line GND. A first emitter of the transistor T13 is connected via a Schottky barrier diode D1 to the base of the phase-splitting transistor T11, connected via a resistor R15 to the power supply line $V_{CC}$, and grounded via a capacitor C1. The resistor R15 and the capacitor C1 constitute an integration circuit, i.e., a delay part. Correspondingly, a second emitter of the transistor T13 is connected via a Schottky barrier diode D2 to the base of the phase-splitting transistor T12, connected via a resistor R16 to the power supply line $V_{CC}$, and grounded via a capacitor C2. The resistor R16 and the capacitor C2 constitute an integration circuit, i.e., a delay part. Also, a Schottky barrier diode D3 is connected between the base of the transistor T11 and the base of the transistor T13, and a Schottky barrier diode D4 is connected between the base of the transistor T12 and the base of the transistor T13. The diodes D3 and D4 feed the charges on the corresponding base back to the base of the input transistor T13.

Next, the operation of the TTL circuit shown in FIG. 3 will be explained with reference to the waveform diagrams shown in FIGS. 4A and 4B.

Initially, the input signal $V_i$ is at L level and the input transistor T13 is turned ON. In this state, the phase-splitting transistors T11 and T12 are turned OFF, and thus the output transistor T10 is turned OFF. Accordingly, the output signal $V_o$ is at H level, i.e., the potential of $V_{OH}$, and therefore, the TTL circuit in FIG. 3 operates as an inverter.

When the input signal $V_i$ changes from L level to H level, the input transistor T13 is turned OFF. Thus, the capacitors C1 and C2 are charged, respectively, through the resistor R15 and the resistor R16 to the potential of $V_{CC}$. Assuming now that the time constant of $<R15> \times <C1>$ is smaller than that of $<R16> \times <C2>$, the phase-splitting transistor T11 is first turned ON, and as a result, the current $IB_1$ is fed to the base of the output transistor T10 and the transistor T10 is turned ON (see FIG. 4B, time $t_1$). However, since the phase-splitting transistor T12 is still turned OFF, the amount of the base current IB is insufficient, and thus the driving ability of the output transistor T10 is not sufficiently increased. Therefore, the output voltage $V_o$ is gradually lowered from the $V_{OH}$ level toward the $V_{OL}$ level.

Next, the phase-splitting transistor T12 is turned ON, and as a result, the current $IB_2$ is fed to the base of the output transistor T10 and forms the base current IB together with the current $IB_1$ (see FIG. 4B, time $t_2$) In this case, the range of the change in the output voltage $V_o$ is relatively small, in the range in which the base current IB is at a maximum. Therefore, the driving ability of the output transistor T10 is sufficiently increased, and the output voltage $V_o$ remains at L level of $V_{OL}$, without an overshoot, ringing or electromagnetic waves. This prevents a mis-operation of the TTL circuit.

Figure 5:
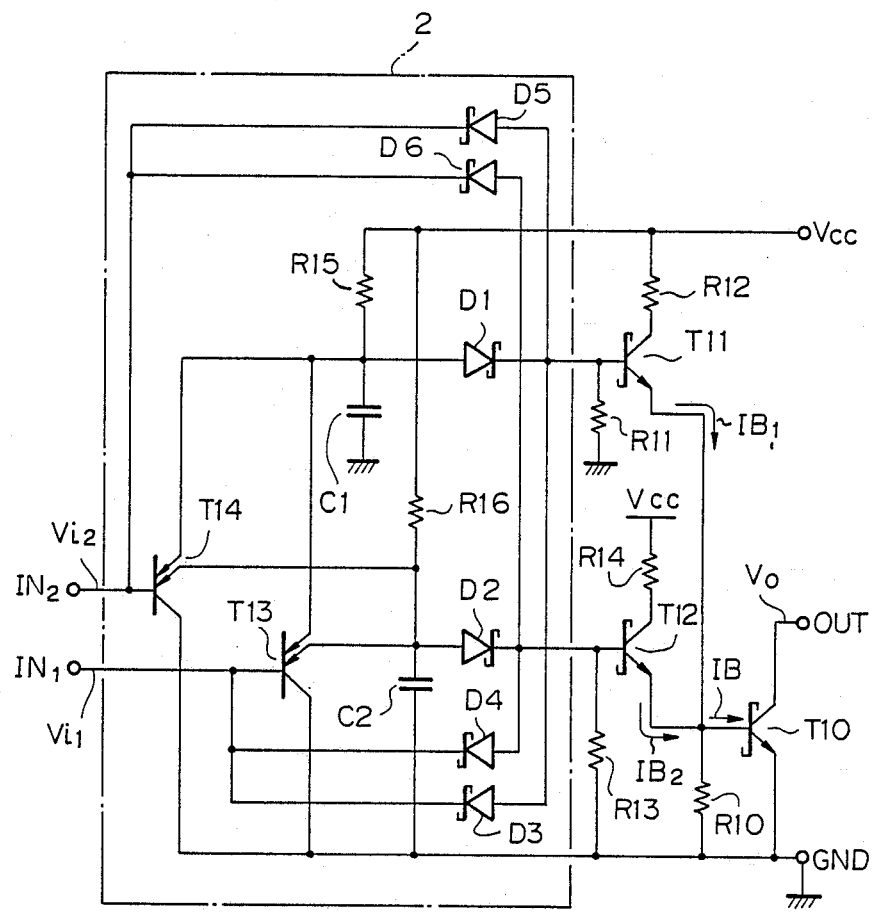
FIG. 5 is a circuit diagram illustrating a modification of the circuit shown in FIG. 3.

FIG. 5 illustrates a circuit diagram of a modification of the TTL circuit shown in FIG. 3.

The TTL circuit in FIG. 5 further includes a second input terminal $IN_2$, a second multi-emitter type PNP input transistor T14, and Schottky barrier diodes D5 and D6 for feeding the charges on the corresponding bases of phase splitting transistors T11 and T12 back to the base of the input transistor T14. According to the delay circuit 2 of FIG. 5, when any one of input signals $V_{i1}$ and $V_{i2}$ is at L level, the phase-splitting transistors T11 and T12 are turned OFF. In this state, the output transistor T10 is also turned OFF, and thus the output signal $V_o$ is at H level. Namely, the TTL circuit in FIG. 5 operates as a two-input type NAND gate.

Figure 6:
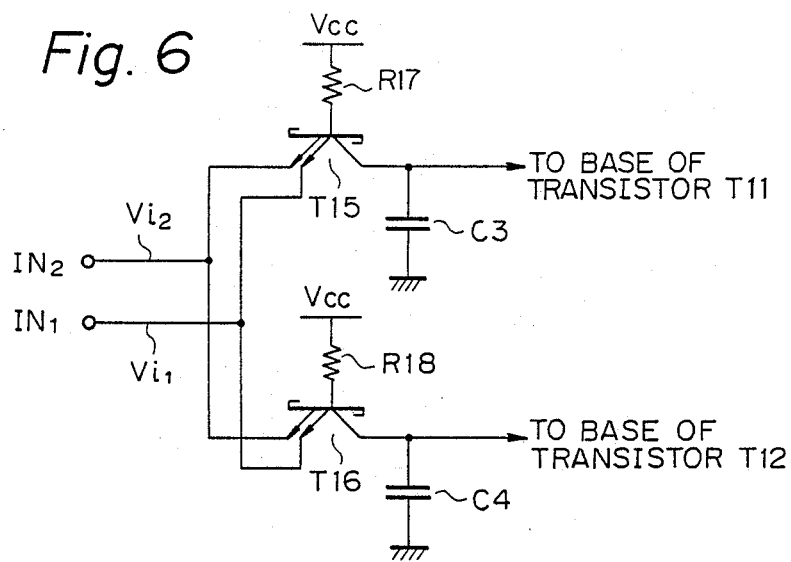
FIG. 6 is a circuit diagram illustrating an example of the delay circuit shown in FIG. 5.

FIG. 6 illustrates another example of the delay circuit 2 shown in FIG. 5. In the delay circuit of FIG. 6, reference T15 denotes a multi-emitter type NPN input transistor having a base connected via a resistor R17 to the power supply line $V_{CC}$ and a collector grounded via a capacitor C3. Two emitters of the transistor T15 are connected to input terminals $IN_1$ and $IN_2$, respectively. The resistor R17 and the capacitor C3 constitute an integration circuit. Similarly, reference T16 denotes a multi-emitter type NPN input transistor having the same form as the transistor T15. The resistor R18 and the capacitor C4 also constitute an integration circuit. In this case, the propagation time in which the change of the input signal $V_{i1}$ or $V_{i2}$ is transmitted to the base of the phase-splitting transistor T11 or T12 is defined by the time constant of $<R17> \times <C3>$, or the time constant of $<R18> \times <C4>$. Note, each time constant is set to a different value.

Figure 7:
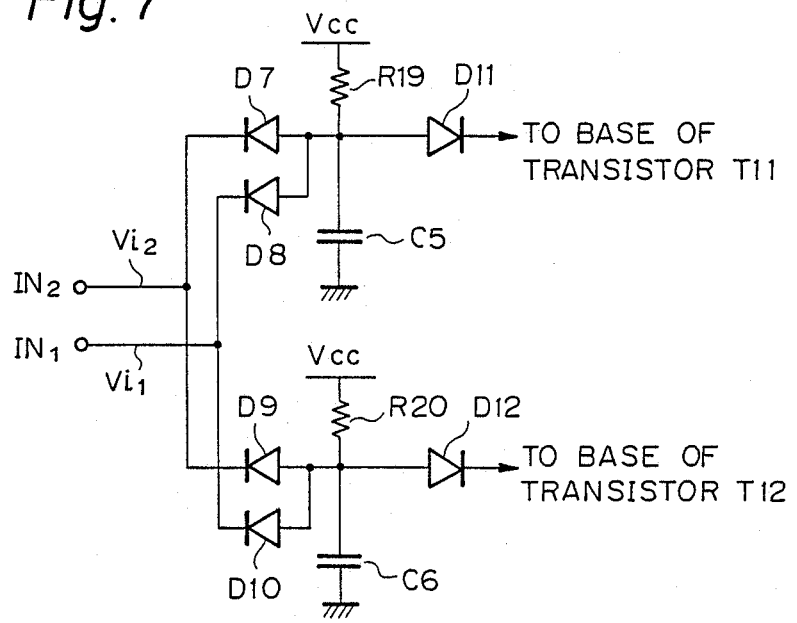
FIG. 7 is a circuit diagram illustrating still another example of the delay circuit shown in FIG. 5.

FIG. 7 illustrates still another example of the delay circuit 2 shown in FIG. 5.

The feature of this delay circuit is the arrangement wherein diodes D7~D10 are employed in place of the multi-emitter type input transistors. In FIG. 7, the signal propagation delay time is defined by the time constant of $<R19> \times <C5>$, or the time constant of $<R20> \times <C6>$. Note these constants have different values. In this embodiment or modification or modifications, the delay circuit includes a plurality of delay parts, each having the form of an integration circuit and having a different signal propagation delay time. As a result, a quick change in the output is controlled and the generation of an overshoot, ringing or noise is substantially checked. At the same time, an increased driving capibility for an output transistor and a high operational performance and reliability of the TTL circuit can be realized.

Another preferred embodiment of the present invention will be described hereinafter in detail with reference to FIGS. 8, 9A, 9B, 10 and 11.

Figure 8:
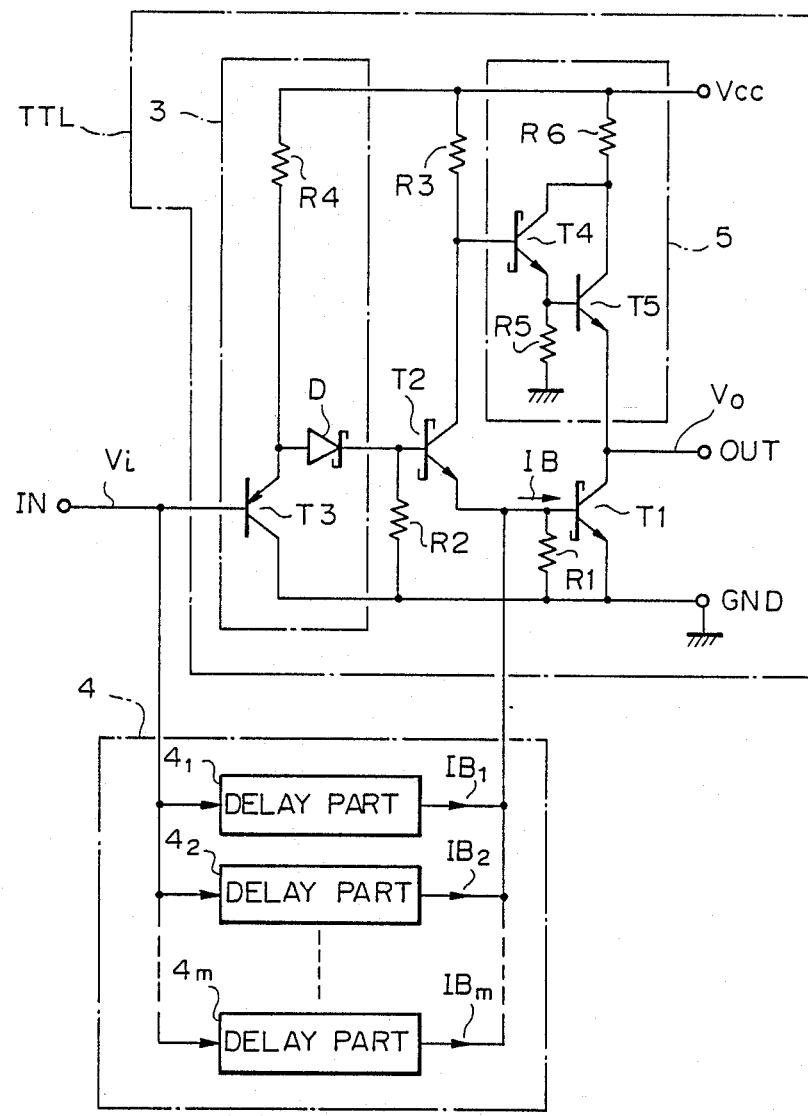
FIG. 8 is a circuit diagram illustrating a TTL circuit as another embodiment of the present invention.

The feature of this TTL circuit is the arrangement wherein a delay circuit 4 is provided between the input terminal IN and the base of the output transistor T1, and includes a plurality of delay parts $4_1 \sim 4_m$ using a portion of internal cells arranged in the form of an array on a semiconductor substrate, as stated later. In FIG. 8, reference 3 denotes an input stage circuit for transmitting the change of the input signal $V_i$ to the base of the phase-splitting transistor T2. Reference 5 denotes an off-buffer circuit, which increases the rate of the rise of the output signal $V_o$ when the signal $V_o$ changes from L level to H level. However, as with the circuit shown in FIGS. 3 or 5, the off-buffer circuit 5 can be omitted. Since other constituent elements of TTL circuit in FIG. 8 and the function thereof are the same as those in FIG. 1, an explanation thereof is omitted.

The delay circuit 4 includes a plurality of delay parts $4_1 \sim 4_m$, each having a different signal propagation delay time, respectively, and, in simultaneous response to the input signal $V_i$, feed base currents $IB_1 \sim IB_m$ to the base of the output transistor T1 in sequence at a different timing. Therefore, the delay circuit 4 as a whole changes the amount of the base current IB in stages, step-by-step.

Figure 9:
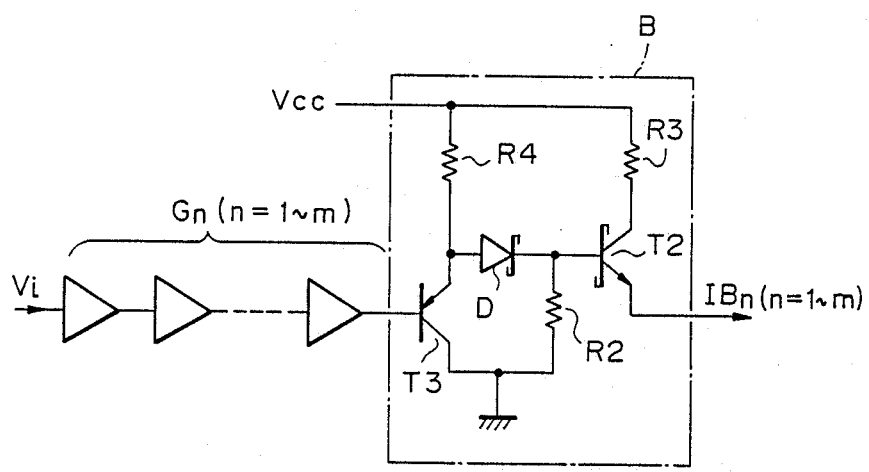
FIG. 9 is a circuit diagram illustrating the delay part shown in FIG. 8.

FIG. 9 illustrates an example of the delay parts $4_1 \sim 4_m$ shown in FIG. 8.

Each delay part has internal gate $G_n(n=1 \sim m)$ consisting of a plurality of gates, and a base current feeding circuit B for outputting the base current $IB_n(n=1 \sim m)$ in response to the input signal $V_i$ delayed through the internal gate $G_n$. In this case, the internal gate $G_n$ in each delay part is formed so that the number of gates increases in sequence. As a result, the signal propagation delay time in the sequence of the delay parts is lengthened. The base current feeding circuit B has the same circuit construction consisting of the input stage circuit 3, the phase-splitting transistor T2 and the resistors R2, R3 as shown in FIG. 8.

Figure 10:
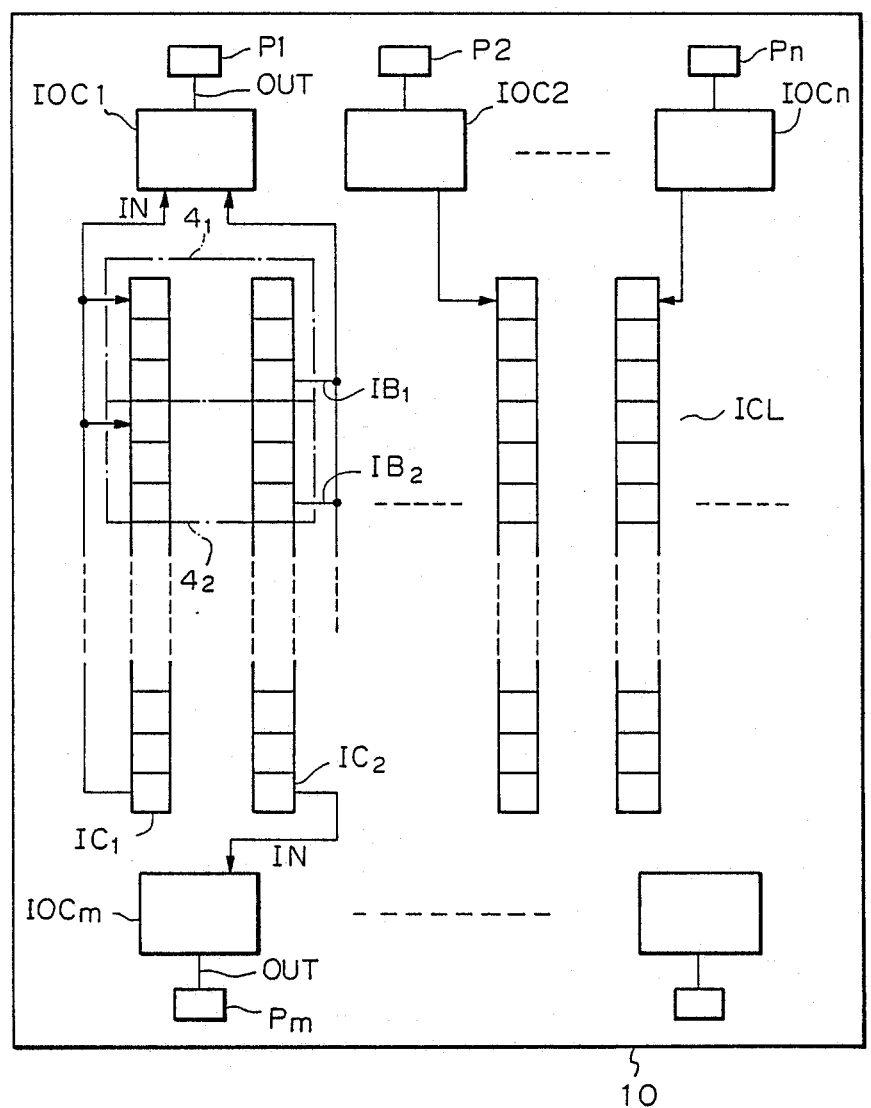
FIG. 10 is a plan view schematically showing an example of the arrangement, on a semiconductor substrate, of the delay part shown in FIG. 9.

FIG. 10 is a block diagram schematically illustrating the whole chip of a gate array utilizing the circuit shown in FIG. 8 according to the present invention. Input-output (I/O) pads $P_1 \sim P_m$ are provided on the periphery of the chip 10, and an internal cell array ICL is provided in the chip 10. References $IOC_1$ and $IOC_m$ denote I/O cells employed as output cells, and references $IOC_2$ and $IOC_n$ denote I/O cells employed as input cells. The TTL circuit shown in FIG. 8 is provided in the I/O cells $IOC_1$ and $IOC_m$. The delay parts $4_1, 4_2, \ldots$, feeding additional base currents to the base of the output transistor I1 of the TTL circuit in the I/O cells $IOC_i$ are constituted by the internal cell array $ICL$.

With respect to the gate array, the driving ability of an output cell in the chip 10 is determined in accordance with design requirement. For example, one output cell is required to have a higher driving ability, and the other is required to have a lower driving ability. Therefore, if the maximum driving ability of the output cell is designed as high as possible, a mis-operation as in the prior art occurs if a light external load is connected to the output. Therefore, the TTL circuit according to the present invention is preferable for an output circuit of a gate array.

In this case, where the circuit including a delay means as shown in FIGS. 3 and 5 is employed in the I/O cells $IOC_1$ and $IOC_m$, the area of the chip is increased. Accordingly, in the gate array shown in FIG. 10, the TTL circuit shown in FIG. 8 is employed in the I/0 cells $IOC_l$ and $IOC_m$, and the delay parts $4_1$, $4_2$, ..., constituted by the internal cell array ICL are connected to the TTL circuit in accordance with the driving ability.

In FIG. 10, the output signal of the internal cell $IC_1$ is input to the I/O cell $IOC_1$ as an input IN. Also, the input IN is input to each delay part $4_1$, $4_2$, ..., The delay parts $4_1$, $4_2$, ..., feed additional base currents $IB_l$, $IB_2$, ..., to the I/O cell $IOC_l$ with a predetermined delay. On the other hand, the output cell $IOC_m$ receives only the output of the internal cell $IC_2$ as the input IN, as a higher driving ability thereof is not required.

Figures 11A, 11B:
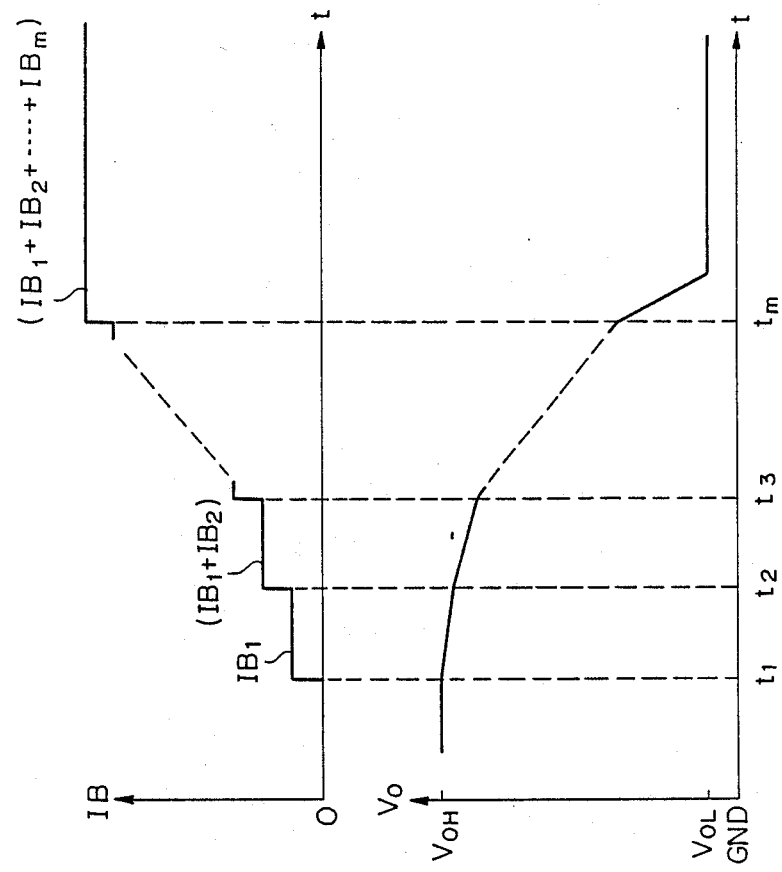
FIGS. 11A and 11B are waveform diagrams illustrating the change of base current in the output transistor and output characteristics of the circuit shown in FIG. 8.

FIGS. 11A and 11B represent waveform diagrams illustrating the change of base current in the output transistor T1 and output characteristics of the circuit shown in FIG. 8.

In the embodiment circuit of FIG. 8, the delay parts $4_1 \sim 4_m$ each have a different signal propagation delay time. Therefore, when the level of the input signal $V_i$ commonly input to each delay part changes from L level to H level at time $t_1$, the delay circuit 4 feeds the base current IB, in stages and increased step-by-step, to the base of the output transistor T1, as shown in FIG. 11A. As a result, the output voltage $V_o$ at the collector of the transistor T1 is gradually lowered and brought to the L level of $V_{OL}$ without an overshoot, ringing or the like, as shown in FIG. 11B.

In addition, according to the circuit of FIG. 8, the signal propagation delay time can be changed as desired by suitably selecting the number of internal gates to be connected in series. Thus, optimum output characteristics can be obtained according to the load, i.e., the external circuit to be driven by the TTL circuit.

The preferred embodiments described above are illustrative and not restrictive, the scope of the invention being indicated by the appended claims and all variations which come within the meaning of the claims are intended to be embraced therein.

I claim:

1. A transistor-transistor logic circuit, comprising:
   first and second power supply lines;
   at least one input terminal operatively connectable to receive an input signal;
   an output terminal;
   an output transistor having a base, an emitter operatively connected to said second power supply line and a collector operatively connected to said output terminal;
   resistors;
   a plurality of phase-splitting transistors, each having a base, an emitter operatively connected to the base of said output transistor and a collector operatively connected through one of said resistors to said first power supply line; and
   a delay circuit operatively connected between said input terminal and each base of said plurality of phase-splitting transistors, transmitting a change of the input signal applied to said input terminal to each base of said plurality of phase-splitting transistors separately and at different propagation delay times.

2. A circuit as set forth in claim 1, wherein said delay circuit comprises a plurality of second delay circuits, each having a different signal propagation delay time, and each being connected so that said plurality of second delay circuits responds simultaneously to the input signal at said input terminal and transmits a change of the input signal separately to each base of said plurality of phase-splitting transistors.

3. A circuit as set forth in claim 1, wherein each of said plurality of second delay circuits comprises an integration circuit having a capacitor and a resistor.

4. A circuit as set forth in claim 3, wherein said delay circuit further comprises a single input transistor corresponding to said plurality of second delay circuits, said input transistor responding to the input signal at said input terminal by transmitting the change of the input signal to each of said plurality of second delay circuits simultaneously.

5. A circuit as set forth in claim 4, wherein said input transistor comprises a multi-emitter type transistor having a base connected to said input terminal, a collector connected to said second power supply line, and two emitters each being connected to a corresponding one of said plurality of second delay circuits.

6. A circuit as set forth in claim 3, further comprising a plurality of input terminals operatively connectable to receive input signals, wherein said delay circuit further comprises a plurality of input transistors corresponding to said plurality of second delay circuits, said plurality of input transistors responding to receiving the input signals from the plurality of input terminals by transmitting a change of each input signal to a corresponding one of said plurality of second delay circuits.

7. A circuit as set forth in claim 6, wherein each of said plurality of input transistor comprises a multi-emitter type transistor having a base connected to one of said plurality of input terminals, a collector connected to said second power supply line, and an emitter connected to a corresponding one of said plurality of delay circuits.

8. A circuit as set forth in claim 3 further comprising a plurality of input terminals operatively connectable to receive input signals, wherein said delay circuit further comprises a plurality of input transistors corresponding to said plurality of second delay circuits, said plurality of input transistors responding to receiving the input signals from the plurality of input terminals by transmitting a change of each input signal to a corresponding one of said plurality of delay circuits parts.

9. A circuit as set forth in claim 8, wherein each of said plurality of input transistors comprises a multi-emitter type transistor having a base connected through the resistor of one of said integration circuits to said first power supply line, a collector connected to a corresponding one of said plurality of second delay circuits, and an emitter connected to a corresponding one of said plurality of input terminals.

10. A circuit as set forth in claim 3, further comprising one or more diodes operativley connected between said input terminal and said plurality of delay circuits.

11. A circuit as set forth in claim 1, formed on a semiconductor substrate.

12. A transistor-transistor logic circuit, comprising:
   first and second power supply lines;
   at least one input terminal operatively connectable to receive an input signal;

an output terminal;

an output transistor having a base, an emitter operatively connected to said second power supply line and a collector operatively connected to said output terminal;

at least one resistor;

a phase-splitting transistor having a base, an emitter operatively connected to the base of said output transistor and a collector operatively connected through the resistor to said first power supply line;

an input stage circuit operatively connected between said input terminal and said phase splitting transistor, transmitting a change of the input signal to the base of said phase-splitting transistor; and a delay circuit having a plurality of second delay circuits operatively connected between said input terminal and the base of said output transistor, each of said second delay circuits having a different signal propagation delay time and, in simultaneous response to the input signal, feeding base currents to the base of said output transistor in a sequence and at the different signal propagation delay times.

13. A circuit as set forth in claim 12, formed on a semiconductor substrate.

14. A circuit as set forth in claim 13, wherein each of said plurality of second delay circuits comprises a plurality of series-connected internal gates being arranged in the form of an array on said semiconductor substrate, said plurality of series connected internal gates providing one of the different signal propagation delay times for the input signal applied to the base of said output transistor.

15. A circuit as set forth in claim 14, wherein each of said plurality of second delay circuits further comprises:

a resistor;

a phase-splitting transistor having an emitter connected to the base of said output transistor and a collector connected through the resistor to said first power supply line; and an input stage circuit operatively connected between said plurality of series connected internal gates and said phase splitting transistor, transmitting an output from said plurality of series-connected internal gates to the base of said phase-splitting transistor.

16. A transistor-transistor logic circuit, comprising:

delay means for receiving an input signal and providing corresponding output signals having different signal propagation delay times;

at least two phase splitting transistors connected to said delay means, receiving the corresponding output signals and providing corresponding drive signals; and an output transistor connected to said transistors, receiving the corresponding drive signals and providing an output.

17. A transistor-transistor logic circuit according to claim 16, wherein said delay means comprises:

at least one multiple emitter type input transistor having first and second emitters and a base connectable to receive the input signals;

a first integrator having a first delay and connected to the first emitter;

a first Schottky barrier diode, connected between said first integrator and the base of said multiple emitter transistor, providing a first feedback current to said multiple emitter transistor;

a second integrator having a second delay and connected to the second emitter, said first and second integrators providing said corresponding output signals in accordance with said first and second delays; and a second Schottky barrier diode, connected between said second integrator and said multiple emitter transistor, providing a second feedback current to said multiple emitter transistor.

18. A transistor-transistor logic circuit according to claim 16, wherein said at least two phase splitting transistors comprise at least two Schottky diode clamp type transistors having respective bases connected to said delay means receiving said corresponding output signals and having respective emitters connected to said output transistor providing said corresponding drive signals to said output transistor.

* * * * *

UNITED STATES PATENT AND TRADEMARK OFFICE
CERTIFICATE OF CORRECTION

PATENT NO. : 4,803,383
DATED : FEBRUARY 7, 1989
INVENTOR(S) : KATSUJI HIROCHI

It is certified that error appears in the above-identified patent and that said Letters Patent is hereby corrected as shown below:

FRONT PAGE, Col. 2, line 3,
                  "Primary Examiner - William L. Sikes"
    should be --Primary Examiner - John S. Heyman--.

Col. 2, line 1, delete "a" (first occurrence).

Col. 5, line 18, after ")" insert --.--;
       line 67, delete "or modifications".

Col. 6, line 5, "capibil-" should be --capabil- --;
       line 38, after "has" insert --an--;
       line 58, "$P_1 \sim P_m$" should be --$P_1 \sim P_m$--.

Col. 7, line 11, "41, 42," should be --$4_1$, $4_2$,--;
       line 16, "," (third occurrence) should be --.--;
       line 67, delete "applied to said input terminal".

Col. 8, line 11, "1" should be --2--;
       line 37, "transistor" should be --transistors--.

Col. 10, line 18, "signals" should be --signal--.

Signed and Sealed this

Third Day of October, 1989

Attest:

DONALD J. QUIGG

Attesting Officer      Commissioner of Patents and Trademarks